United States Patent
Ainspan et al.

(10) Patent No.: US 9,930,325 B2
(45) Date of Patent: *Mar. 27, 2018

(54) MINIMUM-SPACING CIRCUIT DESIGN AND LAYOUT FOR PICA

(71) Applicant: INTERNATIONAL BUSINESS MACHINES CORPORATION, Armonk, NY (US)

(72) Inventors: Herschel A Ainspan, New Hempstead, NY (US); Seongwon Kim, Old Tappan, NJ (US); Franco Stellari, Waldwick, NJ (US); Alan J. Weger, Mohegan Lake, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/939,788

(22) Filed: Nov. 12, 2015

(65) Prior Publication Data

US 2016/0150227 A1    May 26, 2016

Related U.S. Application Data

(63) Continuation of application No. 13/463,166, filed on May 3, 2012, now Pat. No. 9,229,044, which is a
(Continued)

(51) Int. Cl.
*H03K 19/00* (2006.01)
*H04N 17/00* (2006.01)
(Continued)

(52) U.S. Cl.
CPC .............. *H04N 17/002* (2013.01); *G01J 1/44* (2013.01); *G01J 11/00* (2013.01); *G01R 31/26* (2013.01);
(Continued)

(58) Field of Classification Search
None
See application file for complete search history.

(56) References Cited

U.S. PATENT DOCUMENTS

| 4,745,307 A | 5/1988 | Kitamura et al. |
| 4,820,222 A | 4/1989 | Holmberg et al. |

(Continued)

FOREIGN PATENT DOCUMENTS

| JP | 57009103 | 1/1982 |
| KR | 20080097093 | 11/2008 |
| WO | 2010106277 A1 | 9/2010 |

OTHER PUBLICATIONS

Non-Final Office Action issued for U.S. Appl. No. 14/012,668 dated Oct. 28, 2014(13 Pages).

*Primary Examiner* — Anh Tran
(74) *Attorney, Agent, or Firm* — Tutunjian & Bitetto, P.C.; Daniel P. Morris

(57) ABSTRACT

Methods for testing the resolution of an imaging device include forming a plurality of semiconductor devices having proximal light emitting regions, such that the light emitting regions are grouped into distinct shapes separated by a distance governed by a target resolution size. The semiconductor devices are activated by providing an input signal. Light emissions from one or more of the activated semiconductor devices are suppressed by providing one or more select signals.

11 Claims, 6 Drawing Sheets

Related U.S. Application Data continuation of application No. 13/452,092, filed on Apr. 20, 2012, now abandoned.

(51) Int. Cl.
    *H03K 19/094*     (2006.01)
    *H03K 19/14*     (2006.01)
    *G01R 31/26*     (2014.01)
    *G01J 1/44*     (2006.01)
    *G01J 11/00*     (2006.01)
    *G01J 1/42*     (2006.01)

(52) U.S. Cl.
    CPC ........... *H03K 19/094* (2013.01); *H03K 19/14* (2013.01); *G01J 2001/4238* (2013.01)

(56) References Cited

U.S. PATENT DOCUMENTS

| | | |
|---|---|---|
| 5,153,852 A | 10/1992 | Terrell |
| 5,274,283 A | 12/1993 | Hasegawa et al. |
| 5,583,384 A | 12/1996 | Henry |
| 6,260,177 B1 | 7/2001 | Lee et al. |
| 6,628,126 B2 | 9/2003 | Allen |
| 6,895,372 B1 | 5/2005 | Knebel et al. |
| 7,109,962 B2 | 9/2006 | Takeuchi et al. |
| 7,228,464 B2 | 6/2007 | Wilsher |
| 7,772,867 B2 | 8/2010 | Guldi et al. |
| 7,774,662 B2 | 8/2010 | Motika et al. |
| 7,910,418 B2 | 3/2011 | Anderson et al. |
| 8,022,485 B2 | 9/2011 | Davies |
| 9,229,044 B2 * | 1/2016 | Ainspan ............... H03K 19/094 |
| 2007/0131938 A1 | 6/2007 | Williams |
| 2007/0194213 A1 | 8/2007 | Augusto |
| 2009/0027123 A1 | 1/2009 | Brokaw |
| 2011/0001173 A1 | 1/2011 | Öjefors et al. |
| 2011/0221421 A1 | 9/2011 | Williams |
| 2011/0280468 A1 | 11/2011 | Song et al. |

* cited by examiner

Forming a plurality of semiconductor devices having proximal light emitting regions
802

Forming logic circuits to control the semiconductor devices
804

Providing input signals to the semiconductor devices to activate said devices
806

Providing select signals to the logic circuits to selectively suppress light emission from one or more of the semiconductor devices in a desired pattern
808

Changing the select signals to change the pattern of light emission
810

Determining whether an imaging device can discriminate between the two patterns
812

FIG. 8

MINIMUM-SPACING CIRCUIT DESIGN AND LAYOUT FOR PICA

RELATED APPLICATION INFORMATION

This application is a Continuation application of pending U.S. patent application Ser. No. 13/452,092 filed on Apr. 20, 2012, incorporated herein by reference in its entirety.

GOVERNMENT RIGHTS

This invention was made with Government support under Contract No.: FA8650-11-C-7105 (National Security Agency). The government has certain rights in this invention.

BACKGROUND

Technical Field

The present invention relates to test circuit design, and more particularly to creating test circuits for high-resolution picosecond imaging circuit analysis.

Description of the Related Art

Picosecond imaging circuit analysis (PICA) is a technique used for timing measurement and failure analysis of integrated circuits. PICA exploits a side-effect of field effect transistors (FETs) whereby a FET emits a burst of light when its drain region is at a high voltage and its gate transitions from a low voltage to a high voltage. This allows for optical imaging of the back side of an integrated chip circuit to, e.g., locate failed transistors and perform other measurements.

In PICA systems, higher resolutions are desirable to ensure good imaging that can test the limits of circuit design features. To test the resolution of PICA systems, test circuits are created which are designed to produce optical emissions that are close together. Previous attempts to create such test circuits involved compressing circuit layouts parallel and perpendicular to FET gates. Compression parallel to the transistor gate is limited by either polysilicon gate later end-to-end spacing or n-channel metal-oxide-semiconductor to p-channel metal-oxide-semiconductor spacing. Compression parallel to the transistor gate is limited by gate pitch. Exemplary spacings according to such prior art technologies include 284 nm in the parallel spacing and 220 nm in the perpendicular spacing. As such, previous attempts to create PICA test circuits have been limited in their ability to test PICA resolution.

SUMMARY

A method for testing the resolution of an imaging device include forming a plurality of semiconductor devices having proximal light emitting regions, such that the light emitting regions are grouped into distinct shapes separated by a distance governed by a target resolution size. The semiconductor devices are activated by providing an input signal. Light emissions from one or more of the activated semiconductor devices are suppressed by providing one or more select signals.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 8 is a block/flow diagram showing a method for testing an imaging device according the present principles.

DETAILED DESCRIPTION OF PREFERRED EMBODIMENTS

Figure 1:
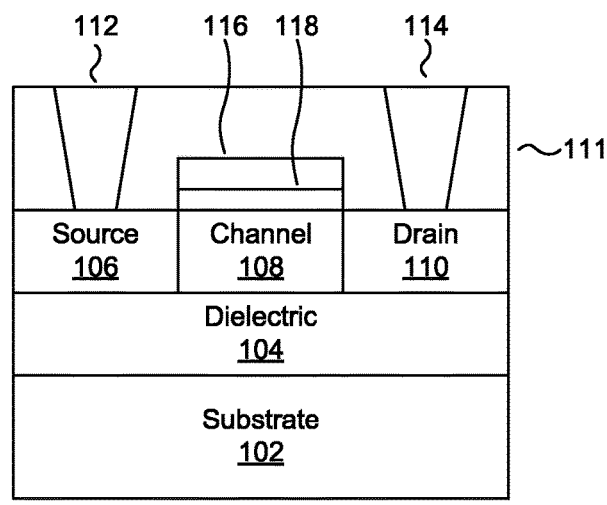
FIG. 1 is a diagram of a field effect transistor according to the present principles.

Picosecond Imaging for Circuit Analysis (PICA) is a powerful optical tool that permits probing time-resolved emission signals collected from transistors inside a circuit, allowing for non-invasive testing of circuit operation. By neglecting the arrival time of photons and constructing a spatial histogram of the measured light, one can create a "PICA image" of the emission intensity. Bright spots indicate individual transistors or sub-circuit units composed by several transistors. By selecting a portion of the image, one can create a histogram of the photon arrival time and, therefore, a waveform in time of the emission activity from that location.

Alternatively, 2D images of the photons at specific times can be created and then a video may be constructed by combining frames. It should be noted that more than one bright spot is usually present in such a PICA image, and the emission may correspond to gates that are not switching, or which are switched with a certain frequency.

Testing the resolution of a PICA camera means determining whether circuit features having a given separation can be distinguished. For example, a PICA camera that can distinguish between adjacent features 100 nm apart has a resolution of at least 100 nm. However, the realities of modern circuit fabrication technologies place practical limitations on how small circuit features can be made and how close together they can be placed.

Field effect transistors (FETs) emit light from their drain regions during operation. One partial solution to forming a high-resolution test circuit is to form two FETs that share a single gate and source node, but have separate drain nodes. This may be used to achieve drain-to-drain spacing that has diffusion edge-to-edge spacing of about 70 nm in a 32 nm fabrication technology. 70 nm is near the resolution limit of PICA tools, and is therefore an effective design for testing the resolution of such tools. As such, the present principles provide test circuits that have minimally spaced transistors sharing a common gate and source node. NOR gates are used to drive separate signals on the drains of the two transistors. Emission from switching gates may be modulated in time, while non-switching gates either do not have an associated emission, or their emissions are not modulated in time.

There are several applications which benefit from quickly distinguishing which bright spot or spots correspond to a switching gate and which do not. One example relates to debugging electrical patterns of a circuit to quickly identify which gate is exercised by the specific pattern, pattern tuning, and pattern debugging. This also helps in applications such as logic state mapping. Another exemplary application relates to security and detecting undesired chip modifications, for example by identifying a set of switching gates and their position in the layout and comparing the identified set to an exemplar.

Being able to detect which gate is switching among many non-switching identical gates helps in circuit probing and diagnostics when limited information about schematic, layout, and circuit behavior is available to a tool operator. Another use for PICA imaging includes assisting a tool operator in better defining and optimizing the region of interest for extracting time resolved waveforms or for further probing with single-point detectors. By readily identifying the regions that correspond to switching gates, one can more easily define the border of the region of interest.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, an exemplary embodiment of a FET according to the present principles is shown. Although only FETs are shown herein, it is contemplated that any semiconductor device can be used in accordance with the present principles if said device produces optical emissions during operation, A substrate layer 102 is formed from any suitable bulk material including, e.g., silicon. A dielectric layer 104 on the substrate layer 102 is formed from any suitable dielectric material such as, e.g., silicon dioxide. An active layer is formed on the dielectric layer 104 including a source region 106, a channel region 108, and a drain region 110, and may be formed from, e.g., doped silicon. The doping the channel region 108 may be of the same kind as the source region 106 and drain region 110, or may be of the opposite polarity.

An insulating layer 111 is disposed on the source 106, channel 108, and drain 110 and may be formed from, e.g., any suitable dielectric. The insulating layer 111 has a source contact 112 and a drain contact 114 that run through the layer 111, providing electrical access to the source region 106 and drain region 110. A gate electrode 116 runs through the insulating layer 111 and is separated from the channel region 108 by a gate dielectric 118. It should be stressed that the depicted FET design is just one that may be used according to the present principles. There are a wide variety of FET designs in the art, and it is contemplated that any appropriate FET can be used.

A FET such as that shown in FIG. 1 will produce an optical signal when a voltage applied to the gate electrode 116 rises above a threshold voltage and voltage at the drain 110 is high, before starting to fall. Thus, if the voltage at the drain 110 is kept biased at a low voltage (e.g., ground), an FET will not emit light when the gate 116 is triggered. This permits selective suppression of FET emissions by using a control signal to bias the FET drain 110 as desired.

Figure 2:
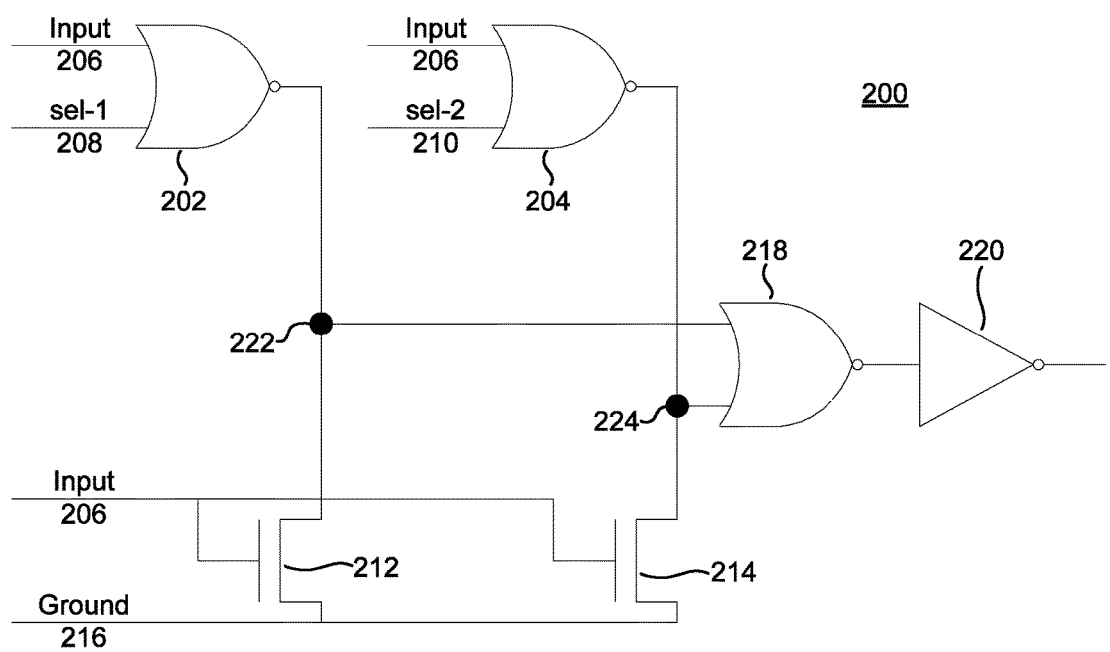
FIG. 2 is a diagram of an exemplary PICA imaging test circuit according to the present principles.

Referring now to FIG. 2, a test buffer circuit 200 is shown. The circuit includes two FETs 212 and 214 triggered at gate electrode 116 by a common input signal 206, where said input signal may be provided as the output signal of a previous buffer circuit 200. The FETs 212 and 214 are connected by their respective source terminals 106 to a common ground 216. The drain terminals 110 of the FETs 212 and 214 are each respectively connected to the output of NOR gates 202 and 204, represented by a first node 222 and a second node 224. The NOR gates 202 and 204 each receive a common input 206 and a respective select input, either sel-1 208 or sel-2 210. The outputs of both NOR gates 202 and 204 are used as the inputs to a third NOR gate 218, which provides its output to inverter 220.

The combination of a NOR gate 202 and FET 212 as shown essentially forms a three-input NOR gate. The select signals sel-1 208 and sel-2 210 are provided externally as opposing waveforms, such that sel-1 208 will have a high value when sel-2 210 has a low value. The select signals 208 and 210 may therefore be switched at regular intervals according to a desired test pattern. For example, the select signals 208 and 210 may alternate values at a rate based on the clock rate of the input signal 206, to allow a desired number of optical pulses to be emitted from each transistor 212 or 214 before switching. Alternatively, select signals 208 and 210 may be held static to allow sufficient light to collect to produce a detectable signal.

If select signal sel-1 208 is low (i.e., logical "0"), then the oscillating input signal 206 will cause the logical value of the signal at node 222 to oscillate with a value opposite that of the input signal 206. As a result, the first transistor 212 emits flashes of light at the drain 110, while the second transistor 214 does not. This is because select signal sel-2 210 causes the drain 110 of transistor 214 to be biased to a logical 0 by the output of the second NOR gate 204, such that triggering the second transistor 214 does not cause a voltage change. Similarly, if the second select signal sel-2 210 is low, then node 224 will oscillate with a value opposite that of the input signal 206 and node 222 will remain fixed at logical 0. In such a case, the second transistor 214 emits a flash of light while the first transistor 212 remains quiescent.

The output of each transistor-NOR pair, represented by nodes 222 and 224, are then passed through a third NOR gate 218 and inverted at inverter 220. This makes the overall function of the circuit 200 that of a buffer, where the output of inverter 220 is the same as the input signal 206.

It should be noted that the NOR gates 202 and 204 represent one preferred embodiment of the present invention, but could in practice be replaced by any logic circuit that accepts the input 206, the two select signals 202 and 204, and produces biased outputs 222 and 224 according to the input states. The NOR-gate arrangement described herein provides a particularly efficient and compact embodiment, but other combinations of logic gates could be used instead.

Using the above circuit 200, the select signals 208 and 210 may be switched between 0 and 1, causing optical emissions detected by a PICA tool to "jump" spatially from the drain 110 of transistor 212 to that of transistor 214. By using a common gate input 116 the physical spacing between transistors 212 and 214 may be minimized, allowing for high-resolution PICA testing. The select signals 208 and 210 may be switched at any appropriate rate, including for example the chip's clock rate and a refresh rate for the PICA imaging device.

Figure 3:
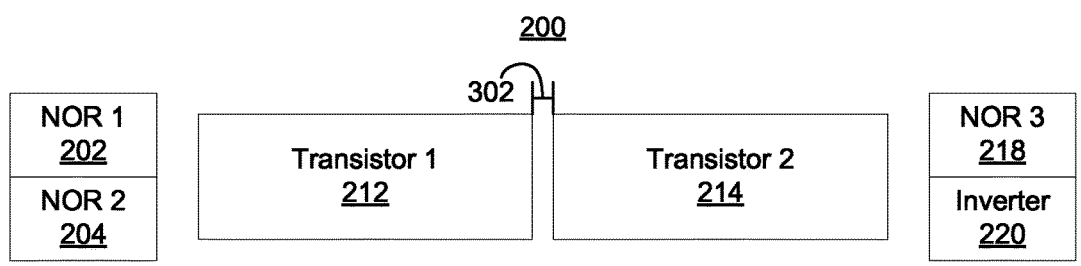
FIG. 3 is a diagram showing an exemplary physical layout of a PICA imaging test circuit on a chip according to the present principles.

Referring now to FIG. 3, a top-down view of the circuit 200 is shown as said circuit could be laid out on a chip. Component interconnections are omitted for clarity. As can be seen, the transistors 212 and 214 are relatively large devices, such that the optical signal produced upon switching is more substantial. The transistors 212 and 214 are formed drain-to-drain with a spacing 302 between them. This spacing 302 represents the physical quantity that the present principles provide for testing PICA camera resolutions. An exemplary spacing has been shown of about 70 nm using 32 nm technology, but because the spacing 302 between transistors 212 and 214 is not limited by a polysilicon gate pitch or by PFET-to-NFET spacing, the spacing can be made as small as the minimum allowed by the fabrication technology used. As new fabrication technologies are devised, the present principles may be applied to reduce the spacing between drains 110 of gates 212 and 214 even further. Furthermore, the spacing can easily be increased above said minimum to allow evaluation of PICA tools that cannot resolve the minimum spacing. This can be accomplished by creating a layout which places the transistors 212 and 214 farther apart.

Figure 4:
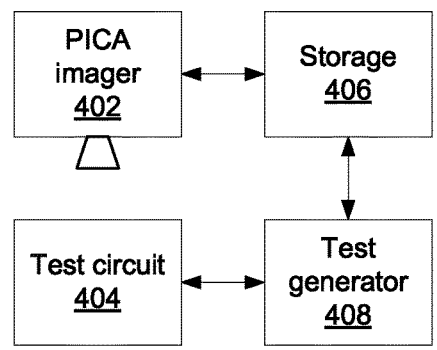
FIG. 4 is a diagram showing an exemplary PICA testing apparatus according to the present principles.

Referring now to FIG. 4, a diagram of an exemplary testing setup is shown. While it is contemplated that the present principles may employed in any imaging system to test maximum resolution, a PICA system is shown in particular. A PICA imager 402 scans a test circuit 404 to detect light emissions from FETs. The PICA imager 402 may take a picture of the entire test circuit at once or it may capture information in a pixel-at-a-time fashion. The PICA imager 402 then stores imaging information in storage 406, which may be any appropriate form of storage, including a disk, tape, physical hard drive, or virtual hard drive such as in a storage access network. The PICA imager 402 may be self-controlled, or may be controlled by a test generator 408. The test generator 408 provides pattern data to test circuit according to a predetermined test sequence. For example, the test generator 408 may control select signals 208 and 210 to produce switching patterns between paired transistors 212 and 214. The test generator may also control physical scanning if needed, for example if the PICA imager 402 or test circuit 404 moves with respect to the other for scanning and imaging purposes.

When the PICA imager 402 scans the test circuit 404, it builds a series of images in storage 406. These images are then analyzed to determine whether the PICA imager 402 has met resolution requirements. In particular, it is considered whether the PICA imager 402 is able to distinguish between the light emissions from a first transistor 212 and a second transistor 214. In some cases, the PICA imager 402 may not be sensitive to detect the output of a single transistor. In that case, the circuit 200 may be repeated and chained, with the output of inverter 220 forming the input 206 of the next circuit 200. By lining the circuits 200 vertically, a strip of active transistors can be created and more easily detected by PICA imager 402. It should also be noted that the exposure length of PICA imager 402 may be orders of magnitude longer than the clock cycle of the input signal 206. As such, the select signals 208 and 210 may be alternated at a rate of once per exposure, rather than being based on the clock rate of the input signal 206.

If a single pixel of recorded light information covers the emissions from both transistors, then the PICA imager 402 has a resolution lower than that needed to fully capture the emission information from the test circuit 404. However, if the PICA imager 402 can reliably distinguish between the emissions from the neighboring transistors 212 and 214, then the imager 402 meets or exceeds the resolution range tested by the test circuit 404.

Figure 5:
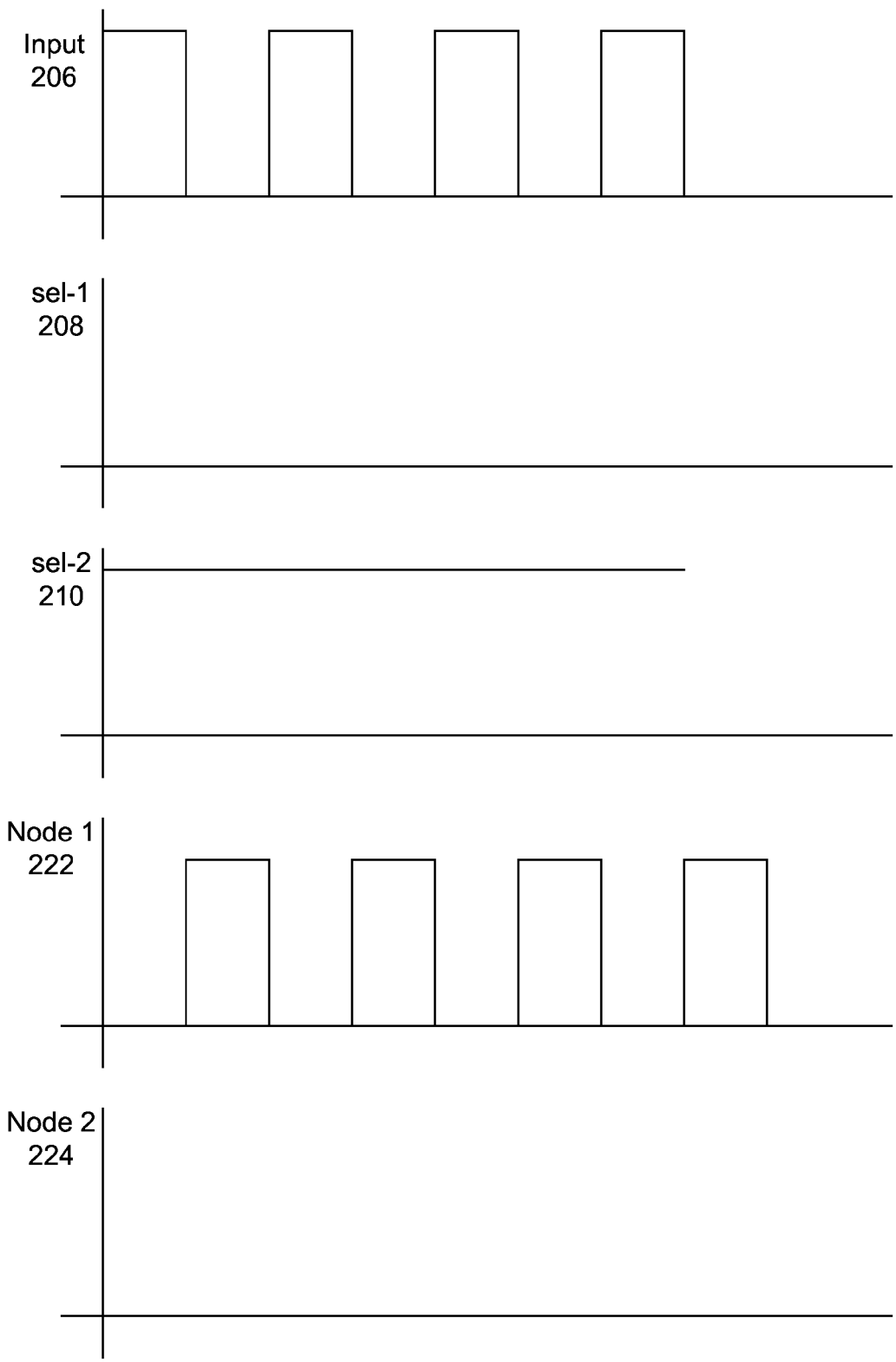
FIG. 5 is a series of signal graphs showing signal values over time at various points within a PICA imaging test circuit.

Referring now to FIG. 5, logical values for signals at a series of points in the circuit of FIG. 2, assuming a logical "0" on the first select signal 208 and a logical "1" on the second select signal 210. The horizontal axis on each graph represents time, while the vertical graph represents the logical value of the signal. It is specifically contemplated that the value may, in turn, represent the voltage of the signal, but the renderings have been kept at a qualitative level for clarity. The input signal 206 oscillates between a logical 1 and a logical 0. The input signal is illustratively described as being a digital square wave, though it is contemplated that any appropriate input signal may be employed. With sel-1 208 being fixed at logical 0, the first NOR gate 202 outputs to node 222 an inversion of the input signal 206. With sel-2 210 being fixed at logical 1, the second NOR gate 204 outputs a fixed logical 0. Because FET optical emissions occur if the gate electrode 116 is triggered while voltage is high at drain 110, and because a low-voltage at 224 biases the drain of the second transistor 214, the second transistor will not emit light while sel-2 210 is set to logical 1. In contrast, the first transistor 212 will flash in time with the input signal 206.

Figure 6:
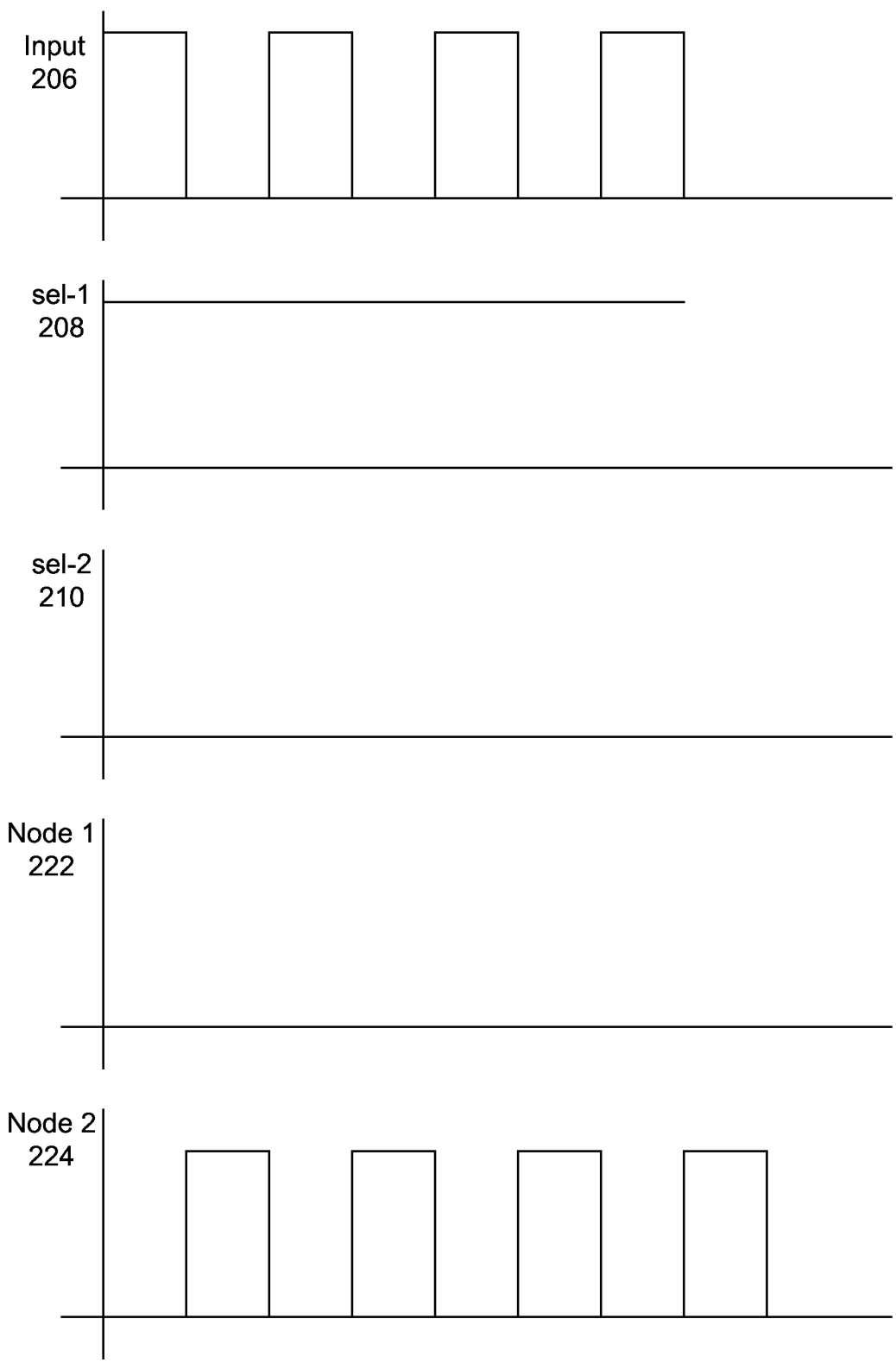
FIG. 6 is a series of signal graphs showing signal values over time at various points within a PICA imaging test circuit.

Referring now to FIG. 6, logical values for signals at a series of points in the circuit of FIG. 2, assuming a logical "1" on the first select signal 208 and a logical "0" on the second select signal 210—inputs that are reversed from those shown in FIG. 5. Again, the horizontal axis on each graph represents time, while the vertical graph represents the logical value of the signal. The input signal 206 continues to oscillate between a logical 1 and a logical 0. With sel-1 208 being fixed at logical 1, the first NOR gate 202 outputs a fixed logical 0 to node 222. With sel-2 210 being fixed at logical 0, the second NOR gate 204 outputs an inversion of the input signal 206 to node 224. Thus, because a low-voltage at 222 biases the drain of the first transistor 212, the first transistor will not emit light while sel-1 208 is set to logical 1. In contrast, the second transistor 214 will flash in time with the input signal 206.

Thus the select signals 208 and 210 control which of transistors 212 and 214 will emit light. The select signals 208 and 210 may then be alternated to cause the light emissions to "jump" between the transistors, providing a predictable signal for the PICA imager 402 to detect.

Figure 7:
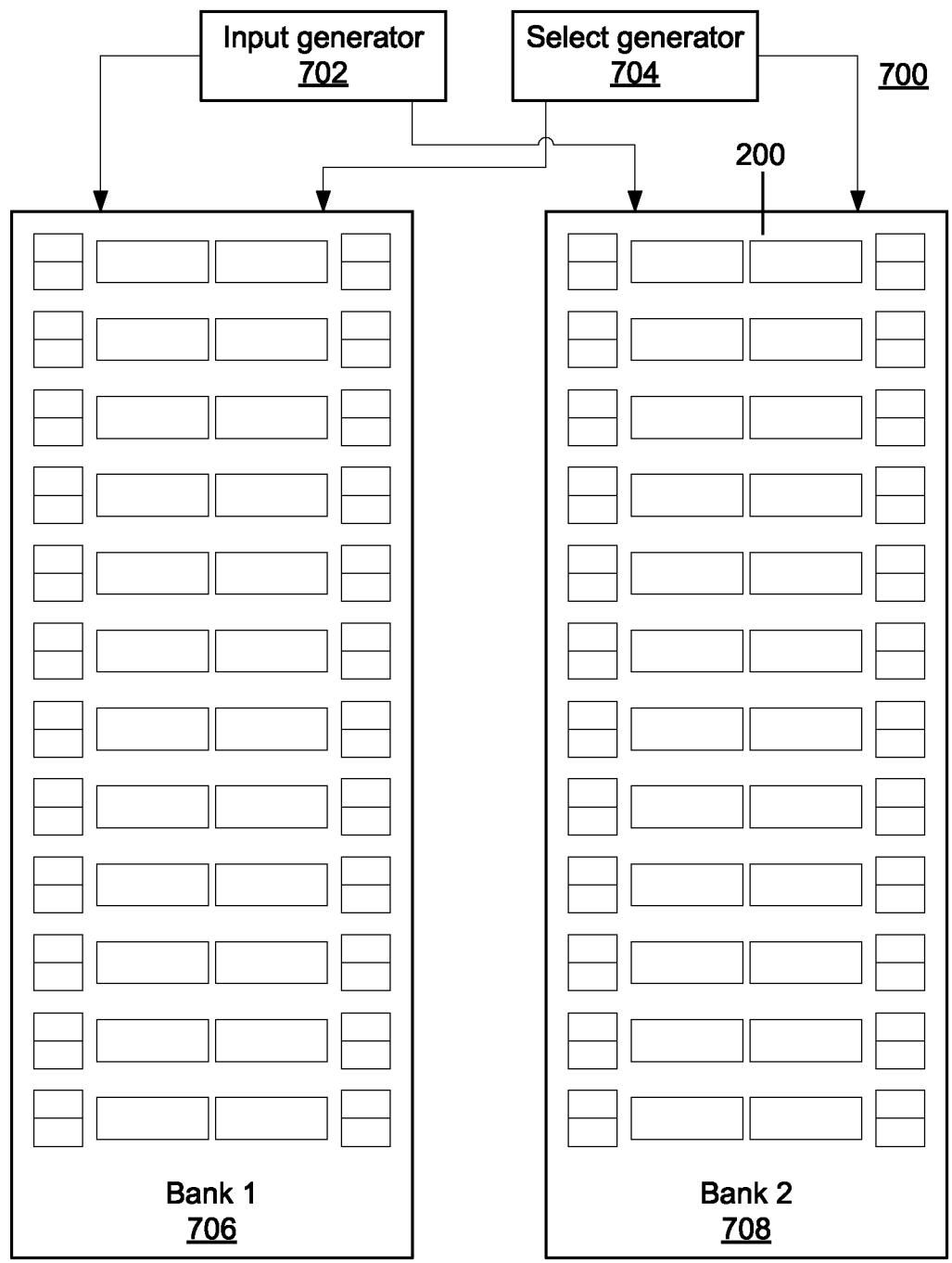
FIG. 7 is a diagram of a PICA imaging test chip that includes multiple PICA imaging test circuits according to the present principles.

Referring now to FIG. 7, an exemplary layout for a testing chip 700 is shown. The chip 700 includes multiple banks 706 and 708 of individual test circuits 200. The test circuits 200 are aligned such that an entire row of transistors will activate at once. This increases the amount of light output along the bank, such that the resolution of a PICA imager 402 can be more easily tested. The banks 706 and 708 receive inputs from input generator 702 and select generator 704. These signals may be generated on-chip or they may be provided off-chip by, e.g., test generator 408. The banks 706 and 708 may furthermore be linked to one another, such that the output the last test circuit 200 in bank 706 produces the input for the first test circuit 200 in bank 708.

The circuit layout described in FIGS. 2 and 3 has additional applicability in minimizing device mismatch. Device mismatch is a condition where transistor characteristics (e.g., threshold voltage) vary across a single chip. Wafer manufacturing processes may cause undesirable variations in transistor characteristics across the wafer such that, for example, components on the left side of the wafer might have a higher threshold voltage than components on the right side of the wafer. The present principles may therefore be applied to a differential pair of transistors where having matched characteristics is desirable. The present principles allow for the placement of transistors as close together as possible to avoid the negative effects of device mismatch. This may have particular applicability where precise timing is important, because a difference in threshold voltage may cause a FET to trigger sooner or later than intended.

Referring now to FIG. 8, a method for testing an imaging device according to the present principles is shown. Block 802 forms a set of semiconductor devices such that their light-emitting regions are next to one another. This could be in the layout shown in FIG. 7, or could take any other appropriate layout. Block 804 forms logic circuits to control the semiconductor devices. Again, these could be the NOR gates 202 and 204 described above, or could be any other suitable combination of logic circuits adapted to control the light emissions of the semiconductor devices. Block 806 provides an input signal 206 to activate the semiconductor devices, and block 808 provides select signals 208 and 210 to the logic circuits to selectively suppress light emissions from some of the semiconductor devices. The select signals are chosen such that a predictable pattern of light emissions is produced. Block 810 then changes the select signals to change the pattern of light emission. Block 812 determines whether an imaging device, such as PICA camera 402 can discern between the patterns of light emission. If so, the imaging device has sufficient resolution of at least the spacing between the semiconductor devices.

Having described preferred embodiments of a minimum-spacing circuit design and layout for PICA (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for testing the resolution of an imaging device, comprising:
    forming a plurality of semiconductor devices having proximal light emitting regions, such that the light emitting regions are grouped into distinct shapes separated by a distance governed by a target resolution size;
    activating the semiconductor devices by providing an input signal; and
    suppressing light emissions from one or more of the activated semiconductor devices by providing one or more select signals.

2. The method of claim 1, further comprising:
    changing the select signals to suppress light emissions from different semiconductor devices; and
    determining whether an imaging device can discriminate between light emission patterns generated under the differing select signals.

3. The method of claim 2, wherein said determining comprises exposing a picosecond imaging circuit analysis device to light emissions from the semiconductor devices.

4. The method of claim 1, further comprising connecting outputs of pairs of semiconductor devices to a logic circuit configured to reproduce the input signal.

5. The method of claim 4, wherein the output of each logic circuit is connected as the input signal to a subsequent pair of semiconductor devices.

6. The method of claim 4, wherein the logic circuits include a NOR gate that accepts the outputs of the semiconductor devices and a NOT gate which inverts the output of the NOR gate.

7. The method of claim 1, further comprising logic circuits connected to a drain region of the respective semiconductor devices, such that a low-bias provided by the logic circuit suppresses light emissions from a selected semiconductor device.

8. The method of claim 1, wherein the semiconductor devices are field effect transistors (FETs).

9. The method of claim 8, wherein the input signal is applied to a gate terminal of the FETs to activate the FETs.

10. The method of claim 1, wherein the distinct shapes are parallel linear arrangements.

11. The method of claim 1, wherein the target resolution size is based on a minimum feature size of a fabrication technology.

* * * * *